(12) United States Patent
Chen et al.

(10) Patent No.: US 9,947,552 B2
(45) Date of Patent: Apr. 17, 2018

(54) STRUCTURE AND FORMATION METHOD OF CHIP PACKAGE WITH FAN-OUT STRUCTURE

(71) Applicant: TAIWAN SEMICONDUCTOR MANUFACTURING CO., LTD., Hsinchu (TW)

(72) Inventors: Shing-Chao Chen, Zhubei (TW); Chih-Wei Lin, Zhubei (TW); Meng-Tse Chen, Changzhi Township, Pingtung County (TW); Hui-Min Huang, Taoyuan (TW); Ming-Da Cheng, Zhubei (TW); Kuo-Lung Pan, Hsinchu (TW); Wei-Sen Chang, Jinsha Township, Kinmen County (TW); Tin-Hao Kuo, Hsinchu (TW); Hao-Yi Tsai, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/195,321

(22) Filed: Jun. 28, 2016

(65) Prior Publication Data
US 2017/0316957 A1     Nov. 2, 2017

Related U.S. Application Data

(60) Provisional application No. 62/329,851, filed on Apr. 29, 2016.

(51) Int. Cl.
*H01L 21/56*        (2006.01)
*H01L 21/48*        (2006.01)
*H01L 23/31*        (2006.01)
*H01L 23/58*        (2006.01)

(52) U.S. Cl.
CPC .......... *H01L 21/566* (2013.01); *H01L 21/486* (2013.01); *H01L 21/568* (2013.01); *H01L 23/315* (2013.01); *H01L 23/3114* (2013.01); *H01L 23/585* (2013.01)

(58) Field of Classification Search
USPC ....... 257/774, 522, 419, 773, 758, 737, 499, 257/762, 764, 506; 438/303, 591, 618, 438/421, 584, 637, 783, 763
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |

(Continued)

*Primary Examiner* — Moin Rahman
(74) *Attorney, Agent, or Firm* — Birch, Stewart, Kolasch & Birch, LLP

(57) ABSTRACT

Structures and formation methods of a chip package are provided. The method includes forming multiple conductive structures over a carrier substrate and disposing a semiconductor die over the carrier substrate. The method also includes disposing a mold over the carrier substrate. The method further includes forming a protection layer between the mold and the carrier substrate to surround the semiconductor die and the conductive structures. In addition, the method includes removing the mold.

19 Claims, 20 Drawing Sheets

(56) References Cited

U.S. PATENT DOCUMENTS

| | | |
|---|---|---|
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2008/0251949 A1* | 10/2008 | Sin ..................... H01L 21/566 257/787 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0113116 A1* | 5/2013 | Chen ..................... H01L 23/48 257/777 |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

\* cited by examiner

STRUCTURE AND FORMATION METHOD OF CHIP PACKAGE WITH FAN-OUT STRUCTURE

PRIORITY CLAIM AND CROSS-REFERENCE

This application claims the benefit of U.S. Provisional Application No. 62/329,851, filed on Apr. 29, 2016, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. One smaller type of packaging for semiconductor devices is a chip-scale package (CSP), in which a semiconductor die is placed on a substrate.

New packaging technologies have been developed to further improve the density and functions of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2 to 2C-2 are top views of various stages of a process for forming a chip package, in accordance with some embodiments.

DETAILED DESCRIPTION

Figure 1A:
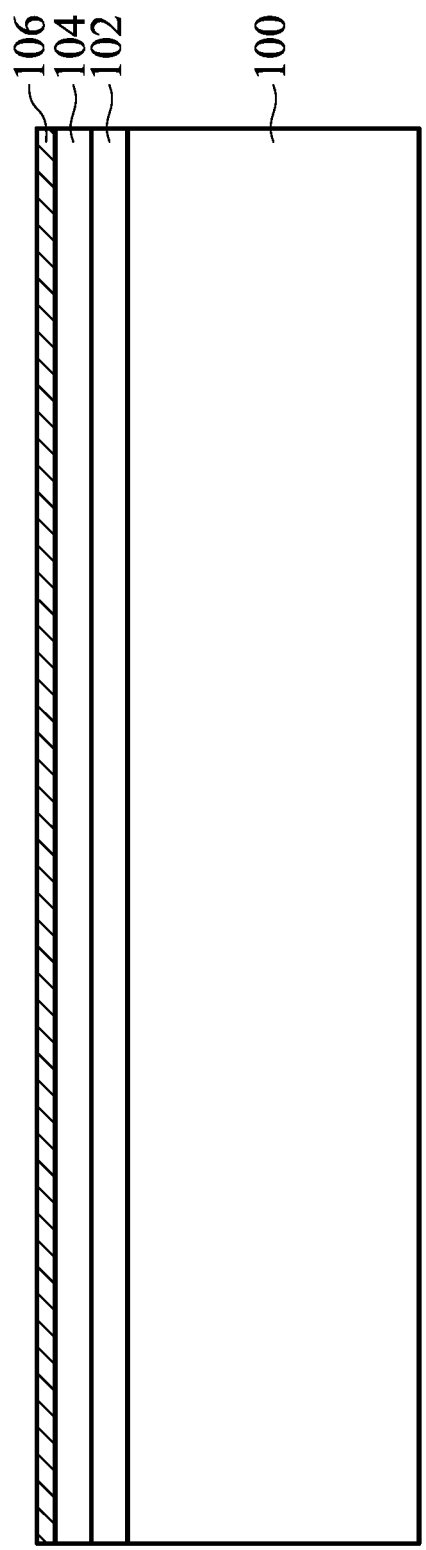
FIGS. 1A-1L are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a chip package, in accordance with some embodiments. As shown in FIG. 1A, an adhesive layer 102 and a base layer 104 are deposited or laminated over a carrier substrate 100, in accordance with some embodiments. In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive. The adhesive layer 102 may be detached using a thermal operation.

In some embodiments, the base layer 104 is a polymer layer or a polymer-containing layer. The base layer 104 may be a poly-p-phenylenebenzobisthiazole (PBO) layer, a polyimide (PI) layer, a solder resist (SR) layer, an Ajinomoto buildup film (ABF), a die attach film (DAF), another suitable layer, or a combination thereof. In some embodiments, the base layer 104 includes multiple sub-layers. In some other embodiments, the base layer 104 is not formed.

Afterwards, a seed layer 106 is deposited over the base layer 104, as shown in FIG. 1A in accordance with some embodiments. In some embodiments, the seed layer 106 is made of a metal material such as copper. In some embodiments, the seed layer 106 is deposited using a physical vapor deposition (PVD) process, a chemical vapor deposition (CVD) process, a spin-on process, another applicable process, or a combination thereof. However, embodiments of the disclosure are not limited thereto. Other conductive films may also be used as the seed layer 106. For example, the seed layer 106 may be made of Ti, Ti alloy, Cu, Cu alloy, another suitable material, or a combination thereof. The Ti alloy or the Cu alloy may include silver, chromium, nickel, tin, gold, tungsten, another suitable element, or a combination thereof. In some embodiments, the seed layer 106 includes multiple sub-layers.

Many variations and/or modifications can be made to embodiments of the disclosure. In some other embodiments, the seed layer 106 is not formed.

Figure 1B:
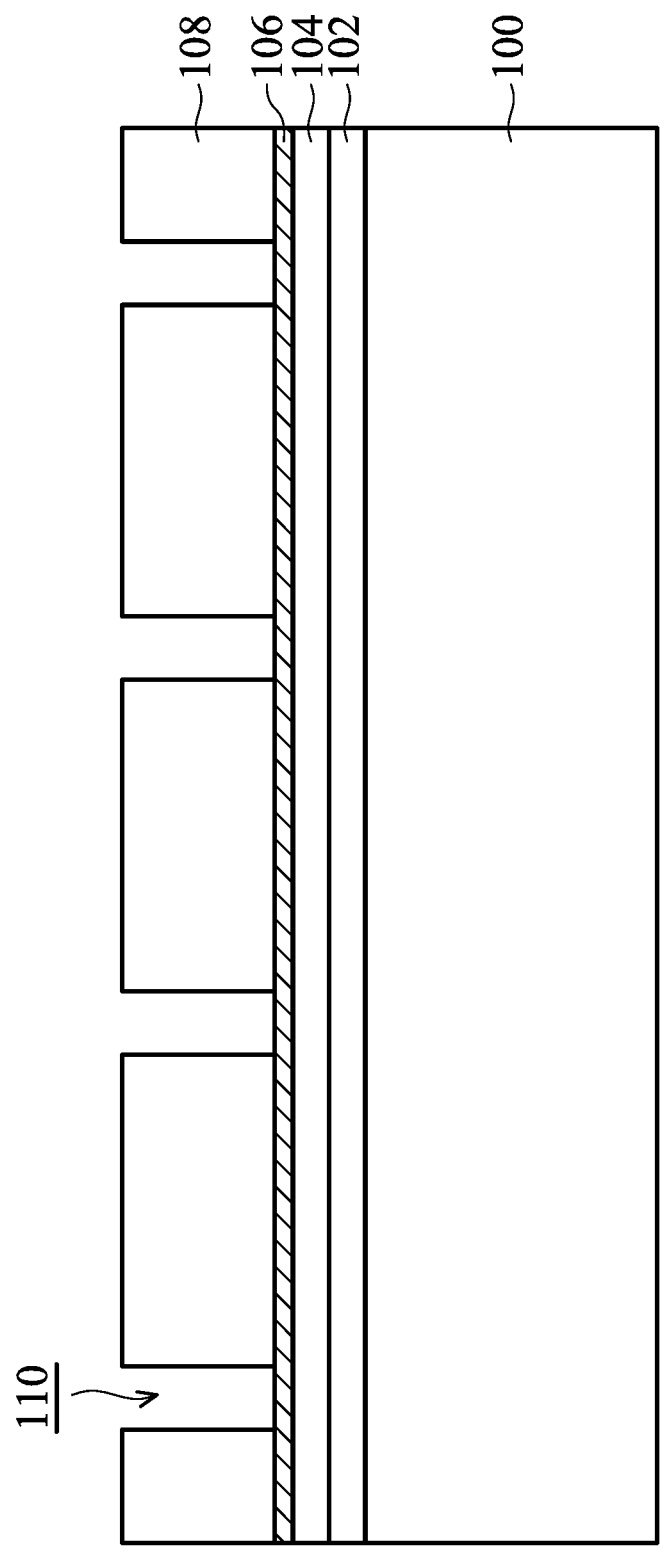

As shown in FIG. 1B, a mask layer 108 is formed over the seed layer 106, in accordance with some embodiments. The mask layer 108 has multiple openings 110 that expose portions of the seed layer 106. The openings 110 of the mask layer 108 define the positions where conductive structures, such as through package vias, will be formed. In some embodiments, the mask layer 108 is made of a photoresist material. The openings of the mask layer 108 may be formed by a photolithography process. The photolithography process may include exposure and development operations.

Figure 1C:
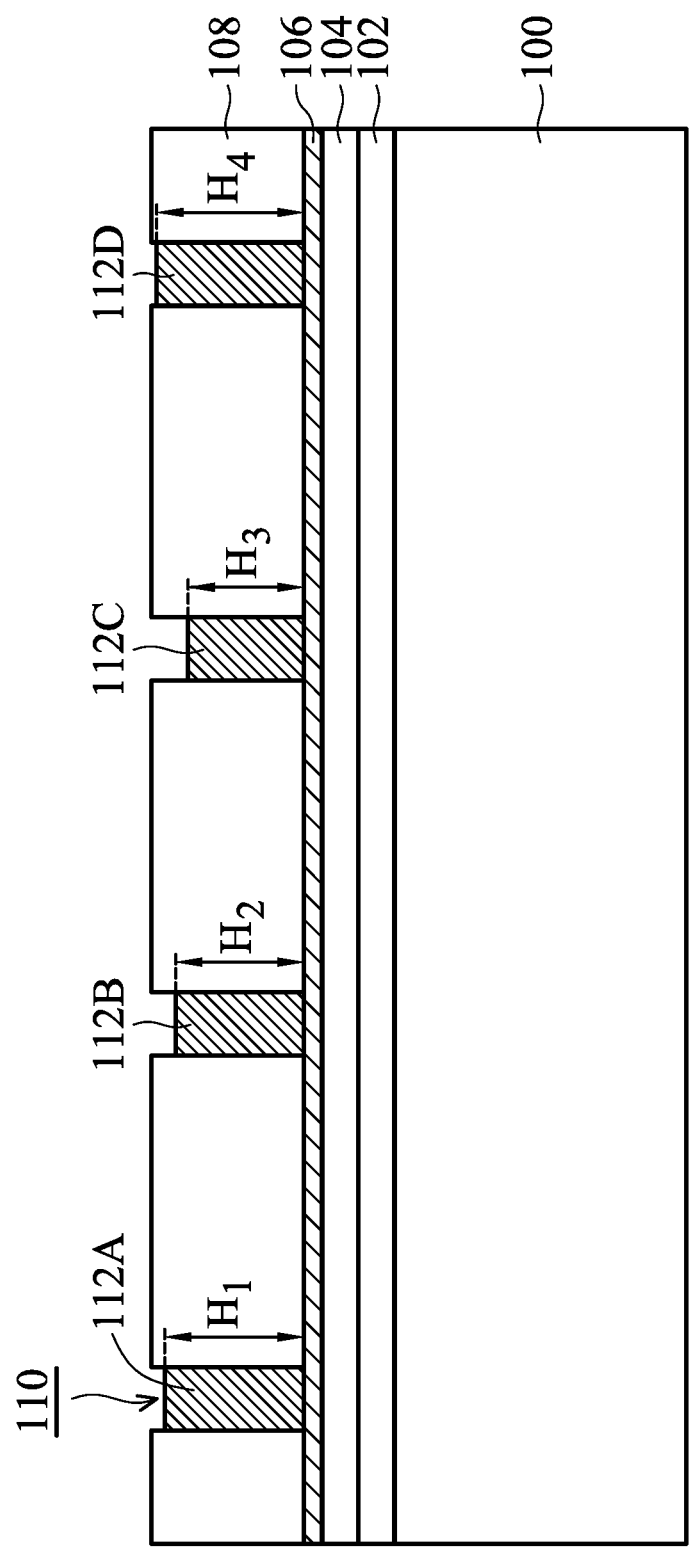

As shown in FIG. 1C, conductive structures including conductive structures 112A, 112B, 112C, and 112D are formed in the openings 110 of the mask layer 108, in accordance with some embodiments. In some embodiments, each of the conductive structures 112A, 112B, 112C, and 112D has a linear sidewall. In some embodiments, the sidewalls of the conductive structures 112A, 112B, 112C, and 112D are substantially perpendicular to the surface of the seed layer 106. In some embodiments, a top view of each of the conductive structures 112A, 112B, 112C, and 112D is substantially circular. In some embodiments, widths of the conductive structures 112A, 112B, 112C, and 112D are substantially the same. In some other embodiments, widths of some of the conductive structures 112A, 112B, 112C, and 112D are different from each other.

In some embodiments, the conductive structures 112A, 112B, 112C, and 112D are made of a metal material. The metal material may include Cu, Ti, Au, Co, Al, W, another suitable material, or a combination thereof. In some embodiments, the conductive structures 112A, 112B, 112C, and 112D are made of a solder material that includes Sn. In some other embodiments, the conductive structures 112A, 112B, 112C, and 112D are made of a metal material that does not include Sn.

In some embodiments, the conductive structures 112A, 112B, 112C, and 112D are formed using a plating process. The plating process may include an electroplating process, an electroless plating process, another applicable process, or a combination thereof. However, many variations and/or modifications can be made to embodiments of the disclosure. In some other embodiments, the conductive structures 112A, 112B, 112C, and 112D are formed using a chemical vapor deposition (CVD) process, a physical vapor deposition (PVD) process, a spin-on process, another applicable process, or a combination thereof.

As shown in FIG. 1C, the conductive structures 112A, 112B, 112C, and 112D have heights $H_1$, $H_2$, $H_3$, and $H_4$, respectively. In some embodiments, the heights $H_1$, $H_2$, $H_3$, and $H_4$ are substantially the same. In some embodiments, some of the heights $H_1$, $H_2$, $H_3$, and $H_4$ are different from each other, as shown in FIG. 1C.

Figure 1D:
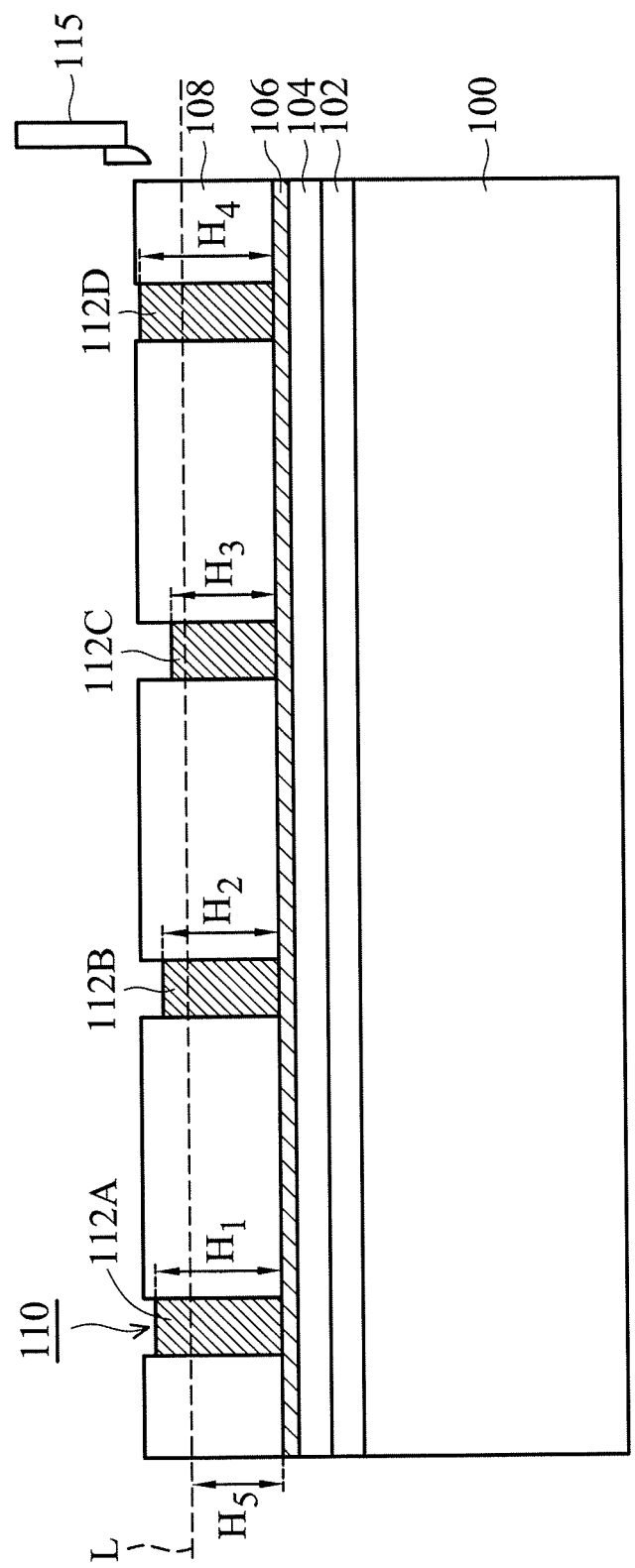

As shown in FIG. 1D, a cutting tool 115 is used to cut upper portions of the conductive structures 112A, 112B, 112C, and 112D, in accordance with some embodiments. The upper portions of the conductive structures 112A, 112B, 112C, and 112D above an imaginary line L will be cut by the cutting tool 115. The imaginary line L may be set at a level to allow each of the conductive structures 112A, 112B, 112C, and 112D having a height $H_5$ after being cut. In some embodiments, an upper portion of the mask layer 108 above the imaginary line L and the upper portions of the conductive structures 112A, 112B, 112C, and 112D are together cut using the cutting tool 115.

Figure 1E:
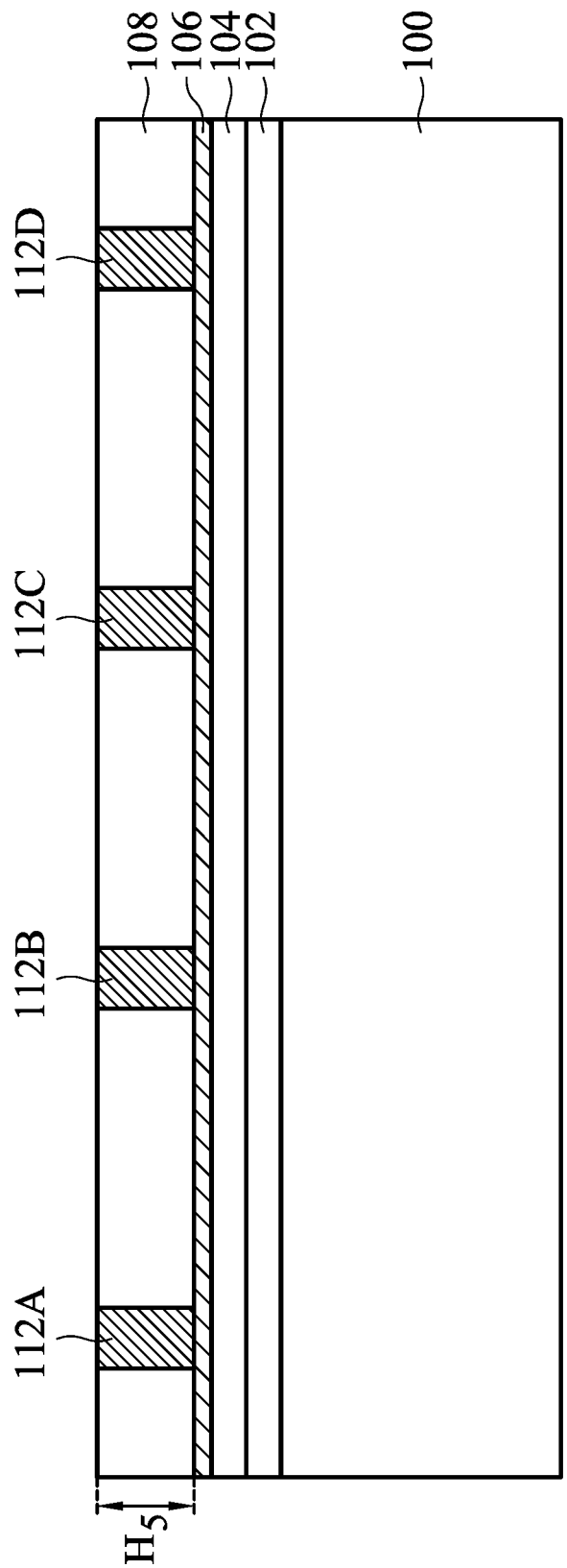

As shown in FIG. 1E, after the cutting operation, the top surfaces of the conductive structures 112A, 112B, 112C, and 112D are substantially coplanar with each other, in accordance with some embodiments. Each of the conductive structures 112A, 112B, 112C, and 112D has the height $H_5$. In some embodiments, due to the cutting operation, the conductive structures 112A, 112B, 112C, and 112D originally have different heights have substantially the same height.

Even if the conductive structures 112A, 112B, 112C, and 112D do not have the same height, the cutting operation allows the conductive structures 112A, 112B, 112C, and 112D to have substantially the same height. The top surfaces of the conductive structures 112A, 112B, 112C, and 112D are substantially coplanar, which facilitates subsequent processes. In some cases, the plating process for forming the conductive structures 112A, 112B, 112C, and 112D may not be required to be performed in a very well controlled manner. In some embodiments, the plating process is performed at a relatively high speed. In some embodiments, the plating process uses a plating solution that is not very expensive. Therefore, the process cost and time are significantly reduced.

Figure 1F:
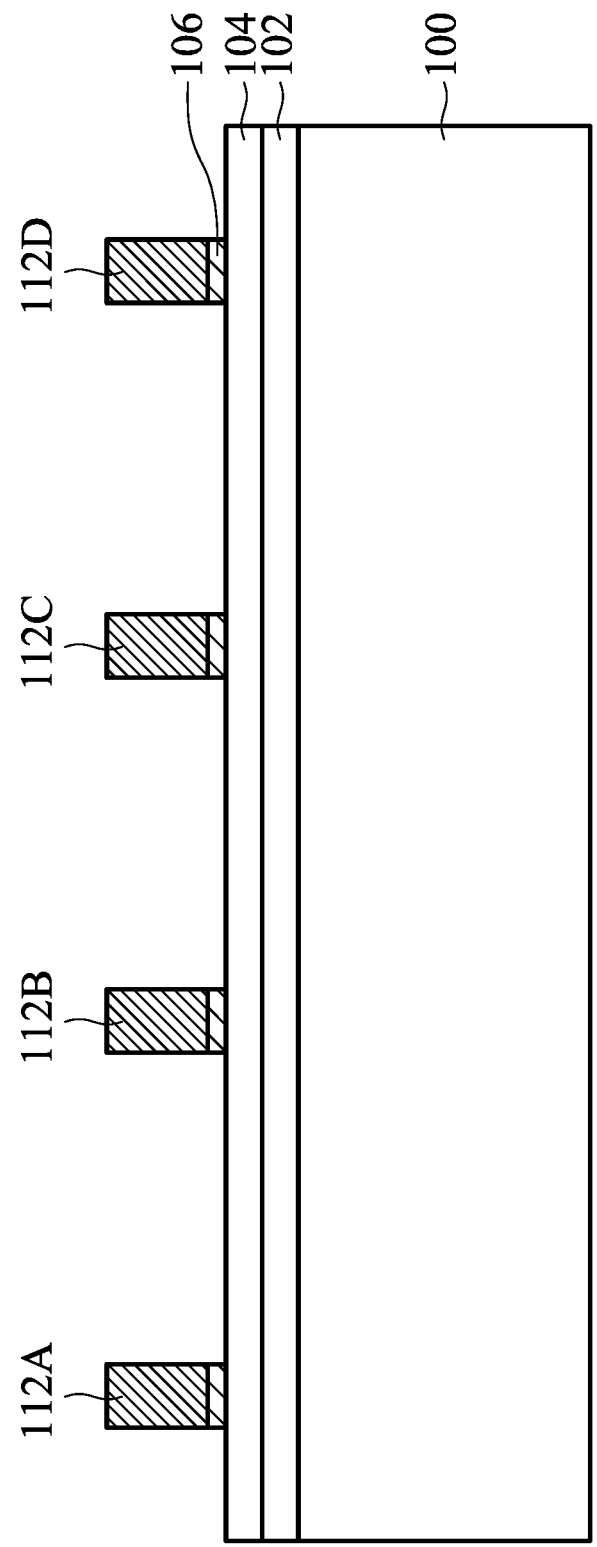

As shown in FIG. 1F, the mask layer 108 is removed, in accordance with some embodiments. Afterwards, the seed layer 106 not covered by the conductive structures including 112A, 112B, 112C, and 112D are removed, as shown in FIG. 1F in accordance with some embodiments. An etching process may be used to partially remove the seed layer 106. The conductive structures including 112A, 112B, 112C, and 112D may function as an etching mask during the etching of the seed layer 106.

Figure 1G:
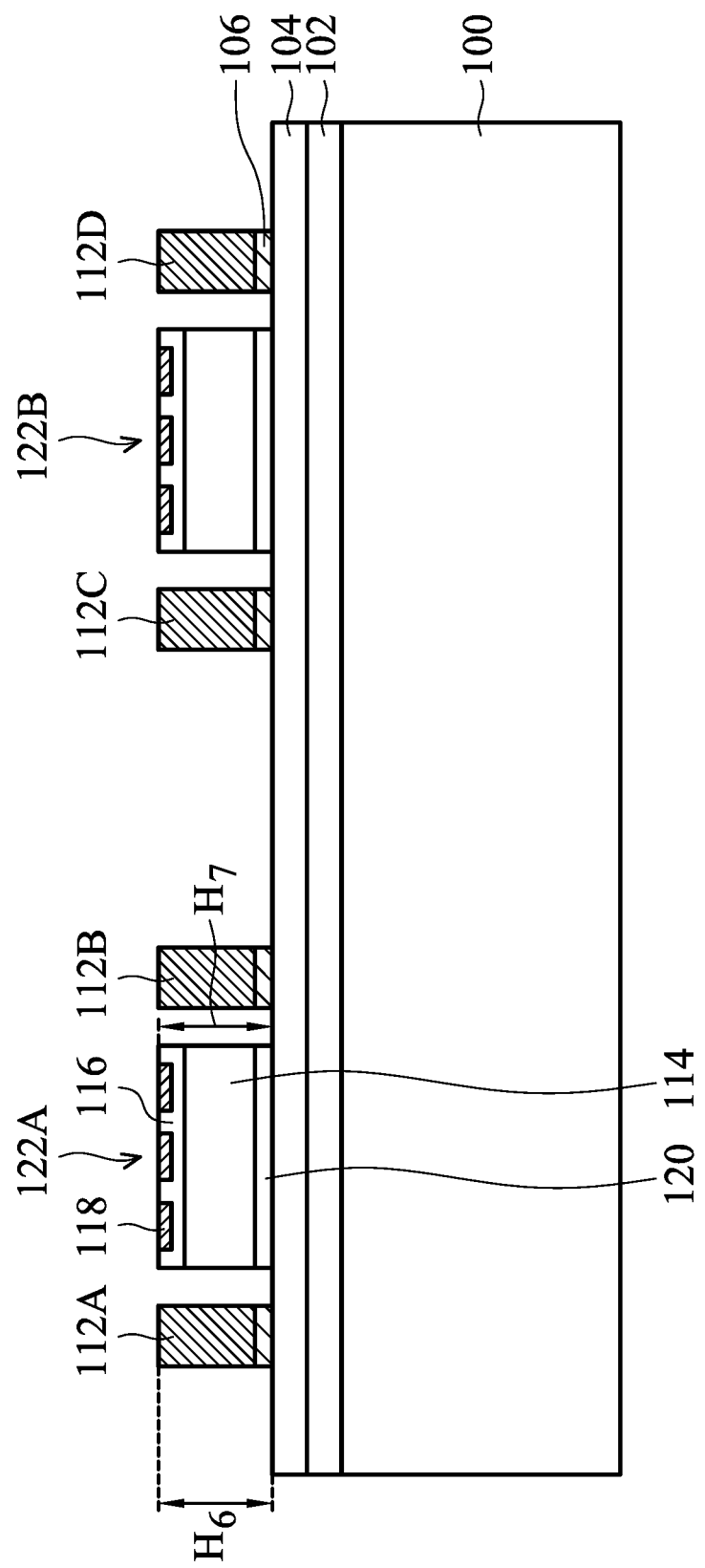

As shown in FIG. 1G, semiconductor dies including semiconductor dies 122A and 122B are attached on the base layer 104, in accordance with some embodiments. In some embodiments, the back sides of the semiconductor dies 122A and 122B face the base layer 104 with the front sides of the semiconductor dies 122A and 122B facing upwards. An adhesive film 120 may be used to fix the semiconductor dies 122A and 122B on the base layer 104. The adhesive film 120 may include a die attach film (DAF), a glue, or another suitable film.

Each of the semiconductor dies 122A and 122B may include a semiconductor substrate 114, a dielectric layer 116, and conductive pads 118 at the front side of the semiconductor die. In some embodiments, various device elements are formed in the semiconductor substrate 114. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements.

The device elements are interconnected to form integrated circuit devices through conductive features formed in the dielectric layer 116. The dielectric layer 116 may include multiple sub-layers. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 122A or 122B is a system-on-chip (SoC) chip that includes multiple functions.

The conductive pads 118 may be wider portions of some of the conductive lines formed on the dielectric layer 116 or embedded in the dielectric layer 116. Therefore, the device elements in the semiconductor substrate 114 may be electrically connected to other elements through the conductive pads 118 and other conductive features.

As shown in FIG. 1G, the seed layer 106 and each of the conductive structures 112A, 112B, 112C, and 112D together have a total height $H_6$. The adhesive film 120 and each of the semiconductor dies 122A and 122B together have a total height $H_7$. In some embodiments, the heights $H_6$ and $H_7$ are substantially the same.

However, many variations and/or modifications can be made to embodiments of the disclosure. In some embodiments, the heights $H_6$ and $H_7$ are different from each other. In some embodiments, the height $H_6$ is greater than the height $H_7$. In some embodiments, the height difference between one of the conductive structures 112A, 112B, 112C, and 112D and one of the semiconductor dies 122A and 122B is substantially equal to the difference between $H_6$ and $H_7$. In some embodiments, the height difference is in a range from about 2 μm to about 3 μm.

Figure 1H:
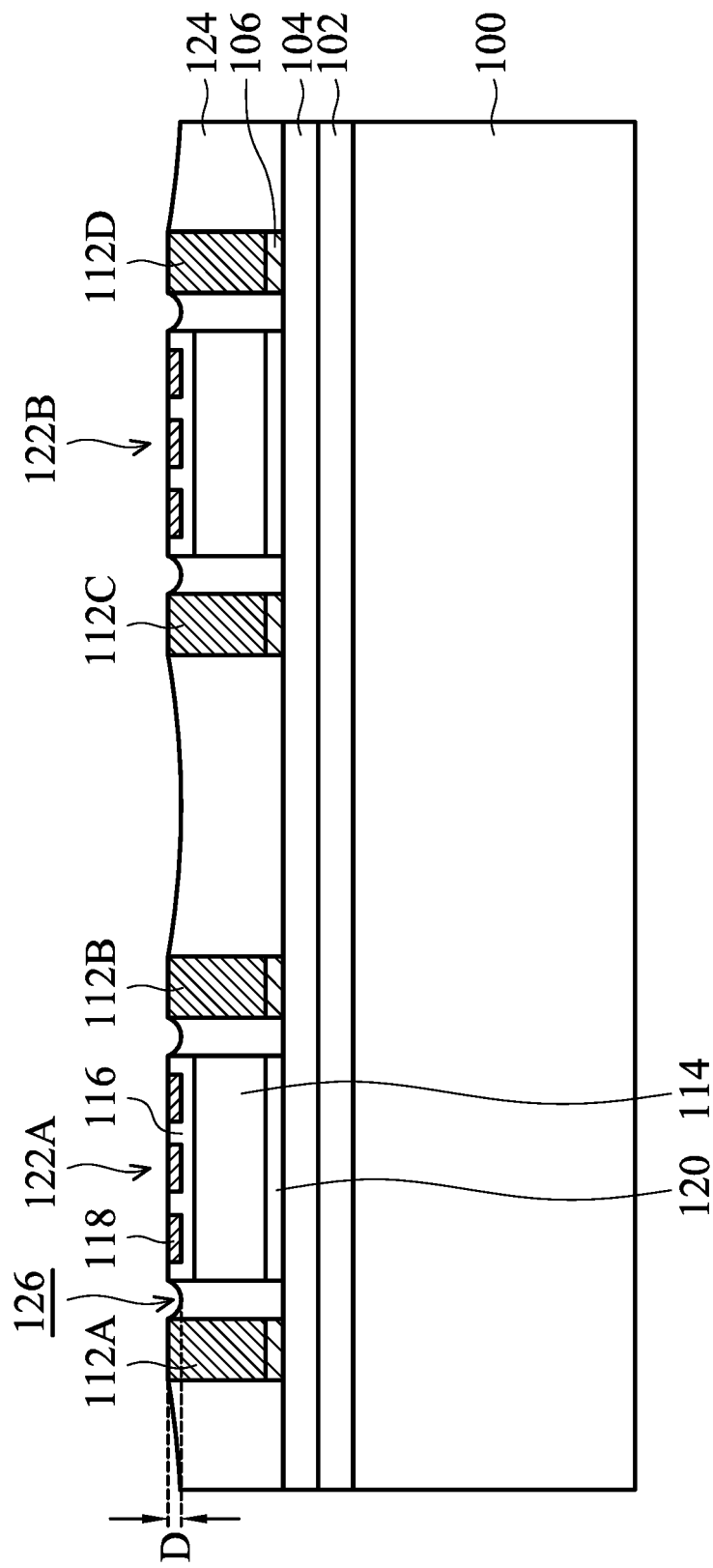

As shown in FIG. 1H, a protection layer 124 is formed over the carrier substrate 100 to surround the conductive structures 112A, 112B, 112C, and 112D and the semiconductor dies 122A and 122B, in accordance with some embodiments. In some embodiments, the protection layer 124 covers sidewalls of the conductive structures 112A, 112B, 112C, and 112D and the semiconductor dies 122A and 122B. In some embodiments, the protection layer 124 does not cover the top surfaces of the conductive structures 112A, 112B, 112C, and 112D and the semiconductor dies 122A and 122B. In some embodiments, the conductive structures 112A, 112B, 112C, and 112D penetrate through the protection layer 124. The conductive structures 112A, 112B, 112C, and 112D are used as through package vias (TPVs) or through integrated fan-out vias (TIVs). In some embodiments, the protection layer 124 includes a polymer material. In some embodiments, the protection layer 124 includes a molding compound material.

In some embodiments, the protection layer 124 is formed by injecting a molding compound material over the carrier substrate 100. In some embodiments, after or during the injecting of the molding compound material, the molding compound material does not covers the top surfaces of the conductive structures 112A, 112B, 112C, and 112D and/or the semiconductor dies 122A and 122B.

In some embodiments, a liquid molding compound material is disposed over the carrier substrate 100 to encapsulate the conductive structures 112A, 112B, 112C, and 112D and the semiconductor dies 122A and 122B. In some embodiments, a thermal process is then applied to harden the liquid molding compound material and to transform it into the protection layer 124. In some embodiments, the thermal process is performed at a temperature in a range from about 200 degrees C. to about 230 degrees C. The operation time of the thermal process may be in a range from about 0.5 hour to about 3 hours.

Figures 1, 2A:
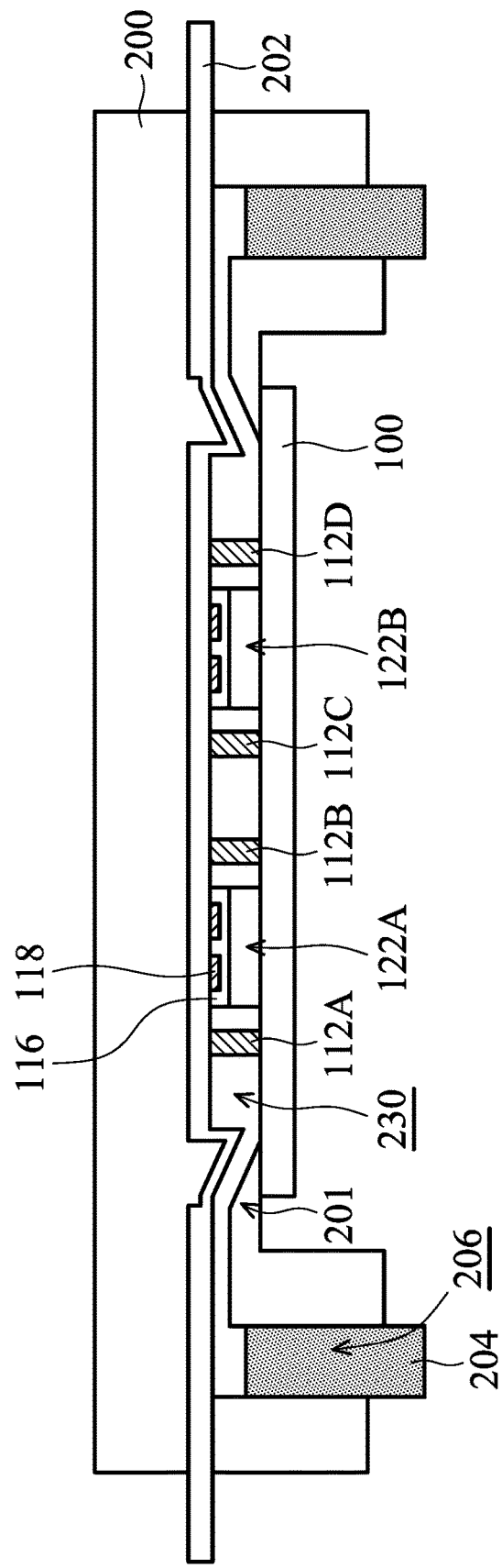
FIGS. 2A-1 to 2C-1 are cross-sectional views of various stages of a process for forming a chip package, in accordance with some embodiments.
Figures 2, 2A:
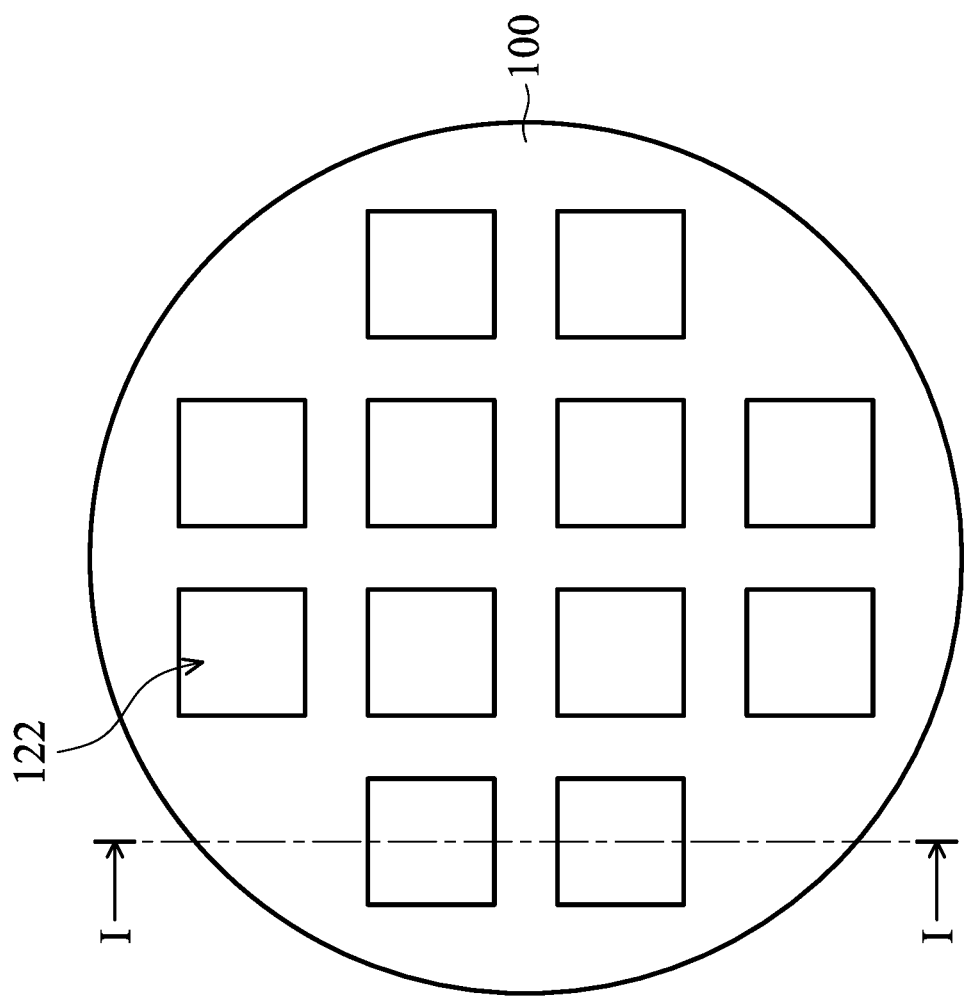

In some embodiments, a mold is used to assist in the formation of the protection layer 124. FIGS. 2A-1 to 2C-1 are cross-sectional views of various stages of a process for forming the protection layer 124 of a chip package, in accordance with some embodiments. FIGS. 2A-2 to 2C-2 are top views of various stages of a process for forming the protection layer 124 a chip package, in accordance with some embodiments.

As shown in FIG. 2A-1, a mold 200 is disposed over the carrier substrate 100, in accordance with some embodiments. In some embodiments, a space 230 is formed between the mold 200 and the carrier substrate 100, as shown in FIG. 2A-1. In some embodiments, the mold 200 includes a sealing element 201. The sealing element 201 may be used to cover the peripheral region of the carrier substrate 100. In some embodiments, the sealing element 201 is a sealing ring. The sealing element 201 may also be used as a settle element that fixes the carrier substrate 100 under the mold 200.

However, many variations and/or modifications can be made to embodiments of the disclosure. In some other embodiments, the sealing element 201 is not formed.

In some embodiments, the mold 200 includes a release film 202. The space 230 is surrounded by the carrier substrate 100, the sealing element 201, and the release film 202. In some embodiments, the release film 202 is made of a material that has a poor adhesion with a molding compound material used for forming the protection layer 124. In some embodiments, the release film 202 is in direct contact with the conductive structures 112A, 112B, 112C, and 112D after the mold 200 is disposed over the carrier substrate 100. In some embodiments, the release film 202 is also in direct contact with the semiconductor dies 122A and 122B.

However, many variations and/or modifications can be made to embodiments of the disclosure. In some other embodiments, the release film 202 is not formed.

In some embodiments, the mold has one or more openings 206. Each of the openings 206 may be used to allow a flow of a molding compound material 204 to be injected into the mold 200. In some embodiments, one or some of the openings 206 are used to allow the flow of the molding compound material 204 to be led out of the mold 200. In some embodiments, each of the openings 206 is used for letting the flow of the molding compound material 204 entering the mold 200. In some other embodiments, the mold 200 has only one opening 206 that allow the flow of the molding compound material 204 entering the space 230.

There are a number of semiconductor dies 122 disposed over the carrier substrate 100, as shown in FIG. 2A-2 in accordance with some embodiments. As shown in FIGS. 2A-1 and 2A-2, there is no molding compound material injected over the carrier substrate 100 at this stage, in accordance with some embodiments.

Figures 1, 2B:
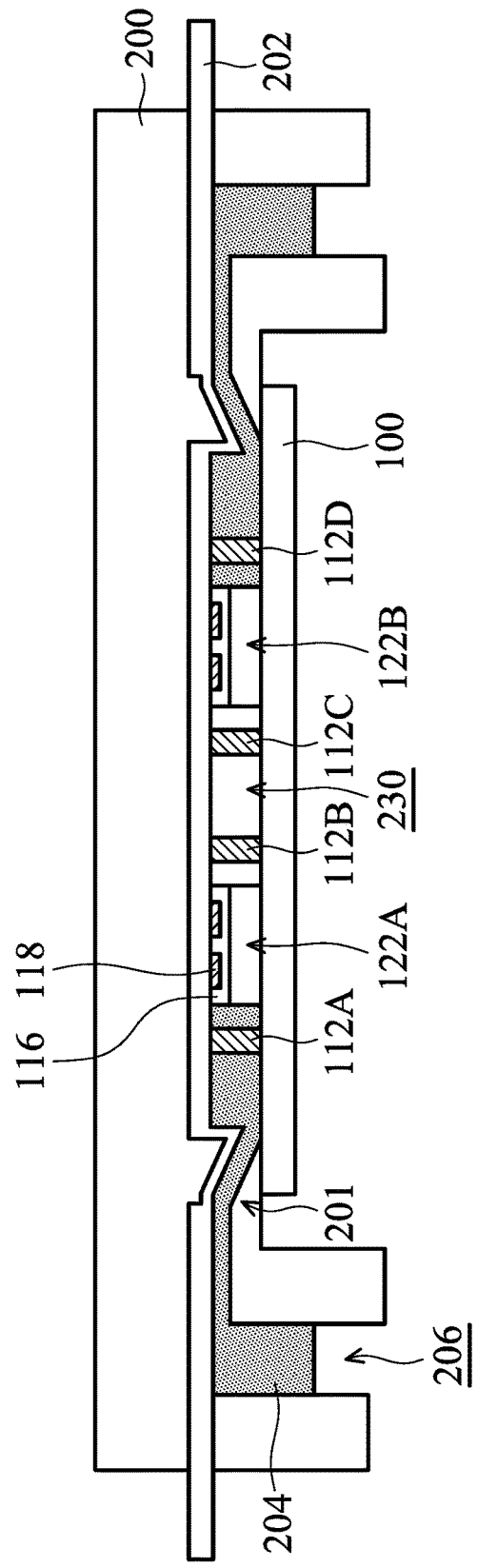
Figures 2, 2B:
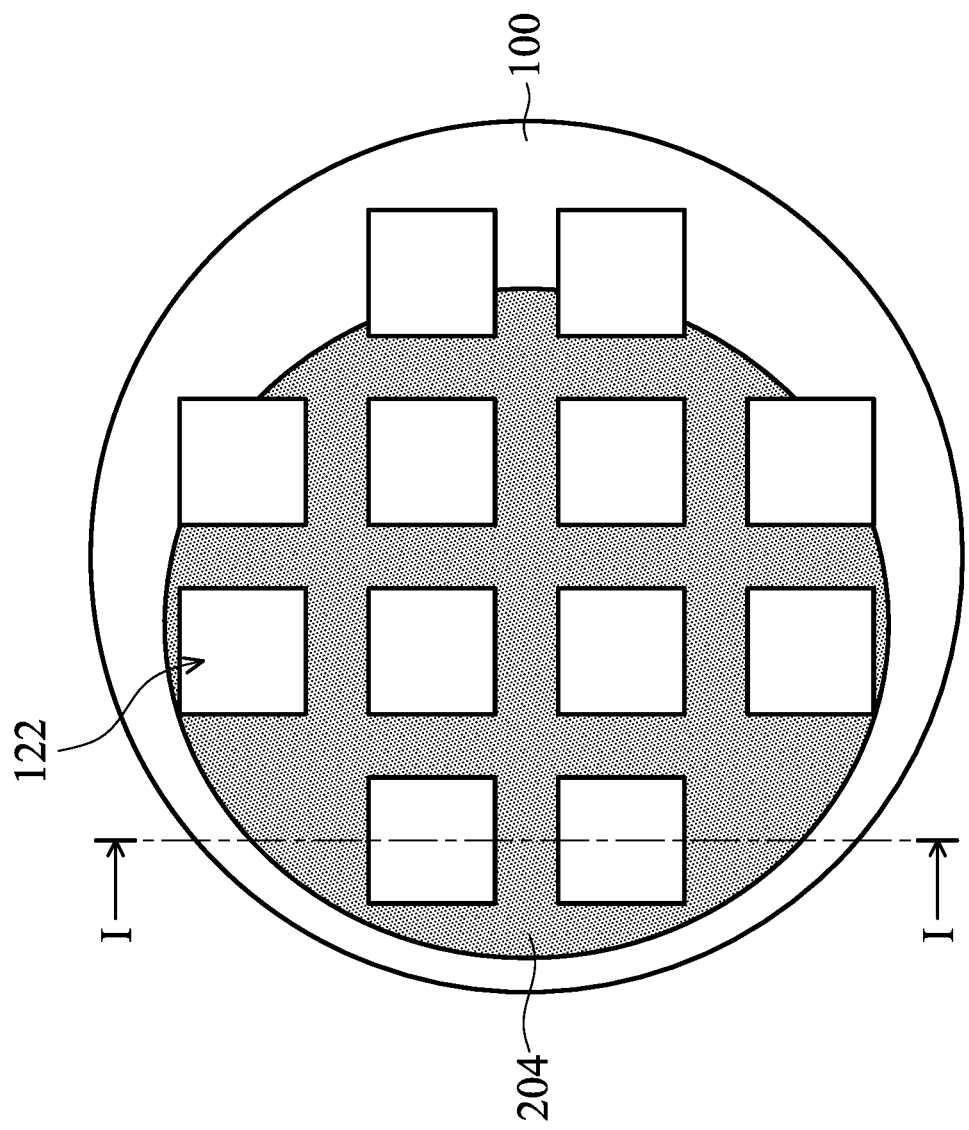
Figures 1, 2C:
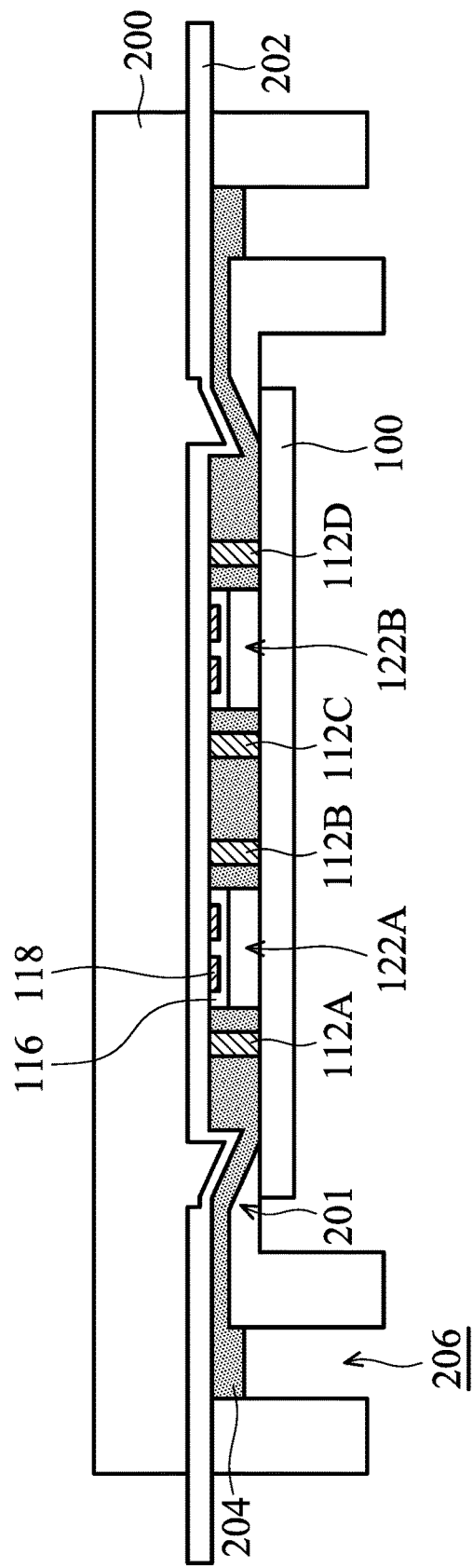
Figures 2, 2C:
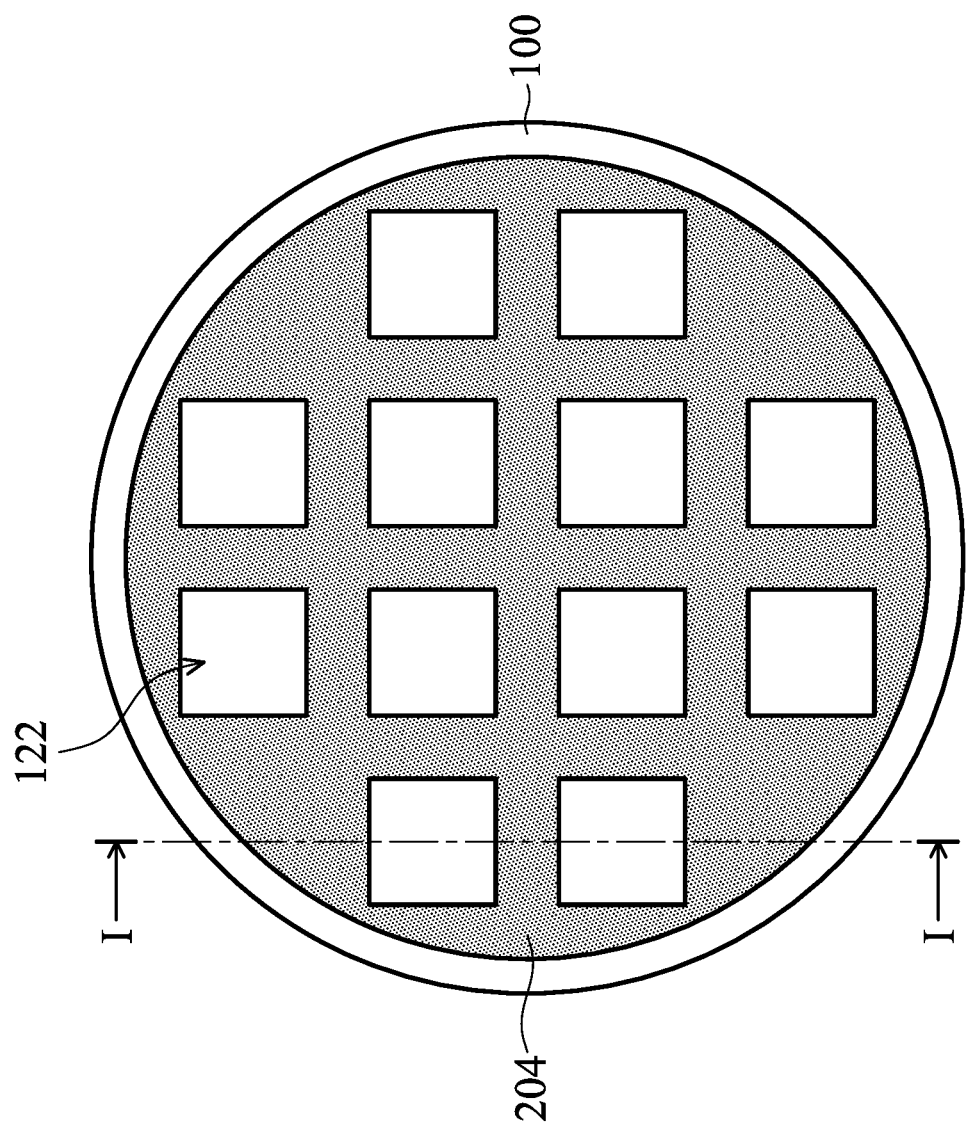

Afterwards, the molding compound material 204 is injected into the space 230 between the mold 200 and the carrier substrate 100, as shown in FIGS. 2B-1 and 2B-2, in accordance with some embodiments. Some of the conductive structures including the conductive structures 112A and 112D are surrounded by the molding compound material 204, as shown in FIG. 2B-1 in accordance with some embodiments. Some of the semiconductor dies 122 including the semiconductor dies 122A and 122B are partially or completely surrounded by the molding compound material 204, as shown in FIGS. 2B-1 and 2B-2 in accordance with some embodiments. In some embodiments, the release film 202 is in direct contact with the conductive structures 112A, 112B, 112C, and 112D during the injecting of the molding compound material 204. In some embodiments, the release film 202 is also in direct contact with the semiconductor dies 122 including the semiconductor dies 122A and 122B during the injecting of the molding compound material 204.

Afterwards, the injected molding compound material 204 completely fills the space 230 between the mold 200 and the carrier substrate 100, as shown in FIGS. 2C-1 and 2C-2, in accordance with some embodiments. In some embodiments, the mold 200 is removed, and the molding compound material 204 is cured to become the protection layer 124, as shown in FIG. 1H. In some embodiments, the molding compound material 204 is cured after the removal of the mold 200. In some other embodiments, the molding compound material 204 is cured before the removal of the mold 200.

In some embodiments, during the injecting of the molding compound material 204 for forming the protection layer 124, the molding compound material 204 does not cover the top surfaces of the conducting structures 112A, 112B, 112C, and 112D and/or the semiconductor dies 122A and 122B due to the mold 200. As a result, the top surfaces of the conducting structures 112A, 112B, 112C, and 112D and the semiconductor dies 122A and 122B are not covered by the protection layer 124, as shown in FIG. 1H. In some embodiments, it is not necessary for the protection layer 124 to be thinned since the conductive structures 112A, 112B, 112C, and 112D and the conductive pads 118 of the semiconductor dies 122A and 122B are exposed without being covered by the protection layer 124.

In some other cases, the mold 200 is not used. In these cases, the conductive structures and the semiconductor dies are covered by the molding compound material. Afterwards, a thinning process may need to be performed to thin down the protection layer so as to expose the conductive structures and the semiconductor dies. Additional passivation layer (such as a PBO layer) and conductive pillars that can sustain the thinning process may need to be previously formed over each of the semiconductor dies to ensure conductive routes to the semiconductor dies. Fabrication cost and process time are therefore high.

In some embodiments that use the mold, since no thinning process to the protection layer 124 is required, fabrication cost and process time are reduced. Damage due to the thinning process may also be prevented. In some embodiments, no additional passivation layer or conductive pillars needs to be formed on the semiconductor dies, and so the fabrication cost and process time are reduced further.

In some embodiments, due to the release film 202, the adhesion between the molding compound material 204 is poor. After the removal of the mold 200, recesses may be formed at the surface of the molding compound material 204. As a result, there are also some recesses 126 formed at the surface of the protection layer 124. As shown in FIG. 1H, the protection layer 124 has recesses 126, in accordance with some embodiments. Some of the recesses 126 are between the semiconductor die 122A or 122B and one of the conductive structures 112A, 112B, 112C, and 112D. Some of the recesses 126 are between two of the conductive structures, such as between the conductive structures 112B and 112C. As shown in FIG. 1H, one of the recesses 126 has a depth D. In some embodiments, the depth D is in a range from about 3 μm to about 10 μm. For example, the depth D may be about 7 μm.

Figure 1I:
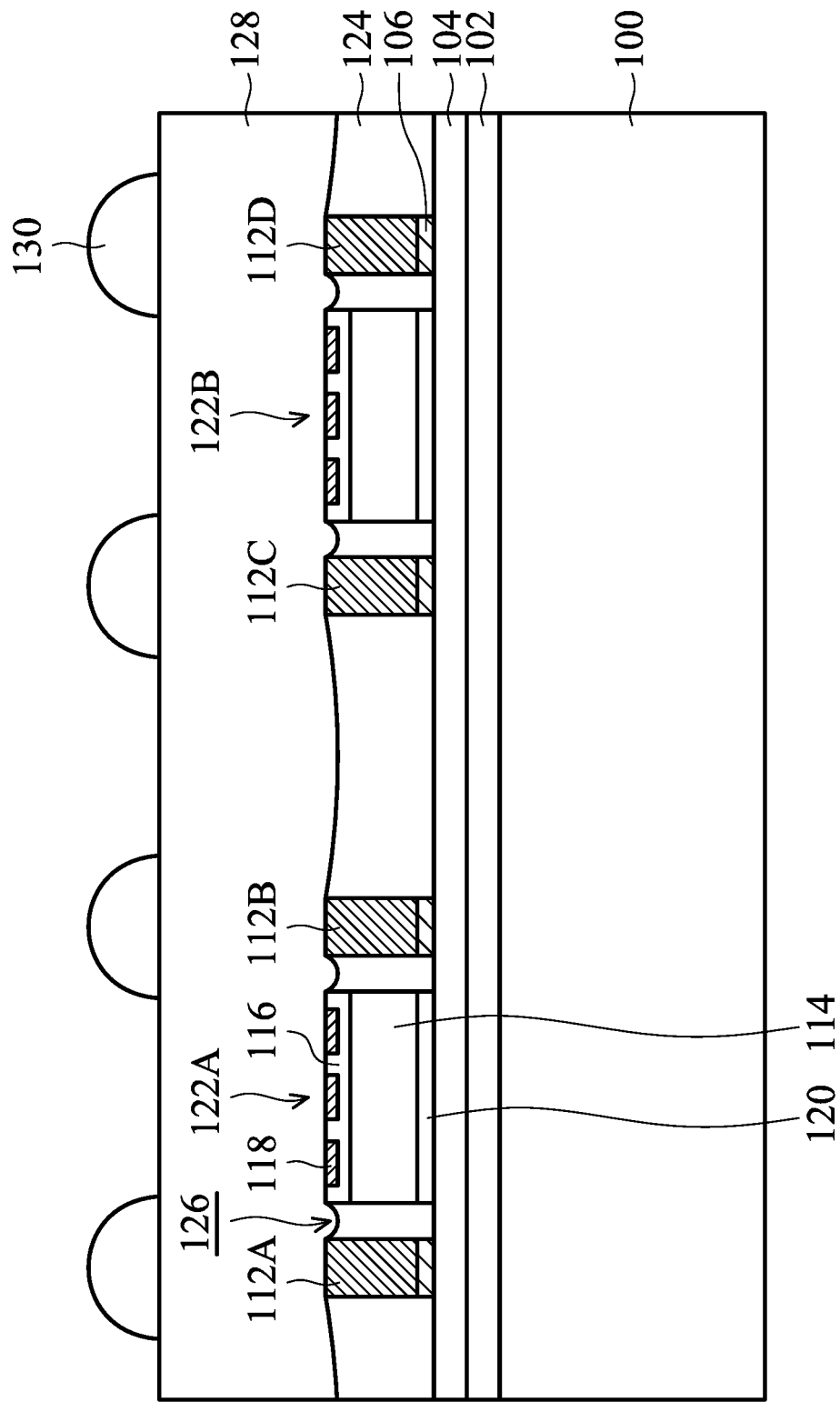

As shown in FIG. 1I, an interconnection structure 128 is formed on the structure shown in FIG. 1H, in accordance with some embodiments. The interconnection structure 128 may include multiple dielectric layers and multiple conductive features (not shown). The multiple dielectric layers may include polymer layers, silicon oxide layers, other suitable layers, or a combination thereof. The multiple conductive features may include conductive lines and conductive vias. Some of the conductive features are electrically connected to the conductive structures 112A, 112B, 112C, 112D, or the conductive pads 118 of the semiconductor dies 122A or 122B. The formation of the interconnection structure 128 may involve multiple deposition processes, multiple patterning processes, and multiple planarization processes.

Afterwards, conductive bumps 130 are formed over the interconnection structure 128, as shown in FIG. 1I in accordance with some embodiments. An under bump metallurgy (UBM) layer (not shown) may be formed below the conductive bumps 130. Each of the conductive bumps 130 may be electrically connected to the conductive structures 112A, 112B, 112C, 112D, or the conductive pads 118 of the semiconductor dies 122A or 122B through some of the conductive features of the interconnection structure 128. In some embodiments, the conductive bumps 130 include solder bumps, metal pillars, metal pillars having linear sidewalls, metal pillars containing no tin, other suitable conductive structures, or a combination thereof.

In some embodiments, the protection layer 124 and the conductive structures 112A, 112B, 112C, and 112D are not planarized after the removal of the mold 200 and before the formation of the interconnection structure 128. In some embodiments, the protection layer 124 is not thinned before the formation of the interconnection structure 128. Damage caused by the planarization process or thinning process may therefore be prevented. The reliability and performance of the chip package are improved. Fabrication cost and process time are reduced.

Figure 1J:
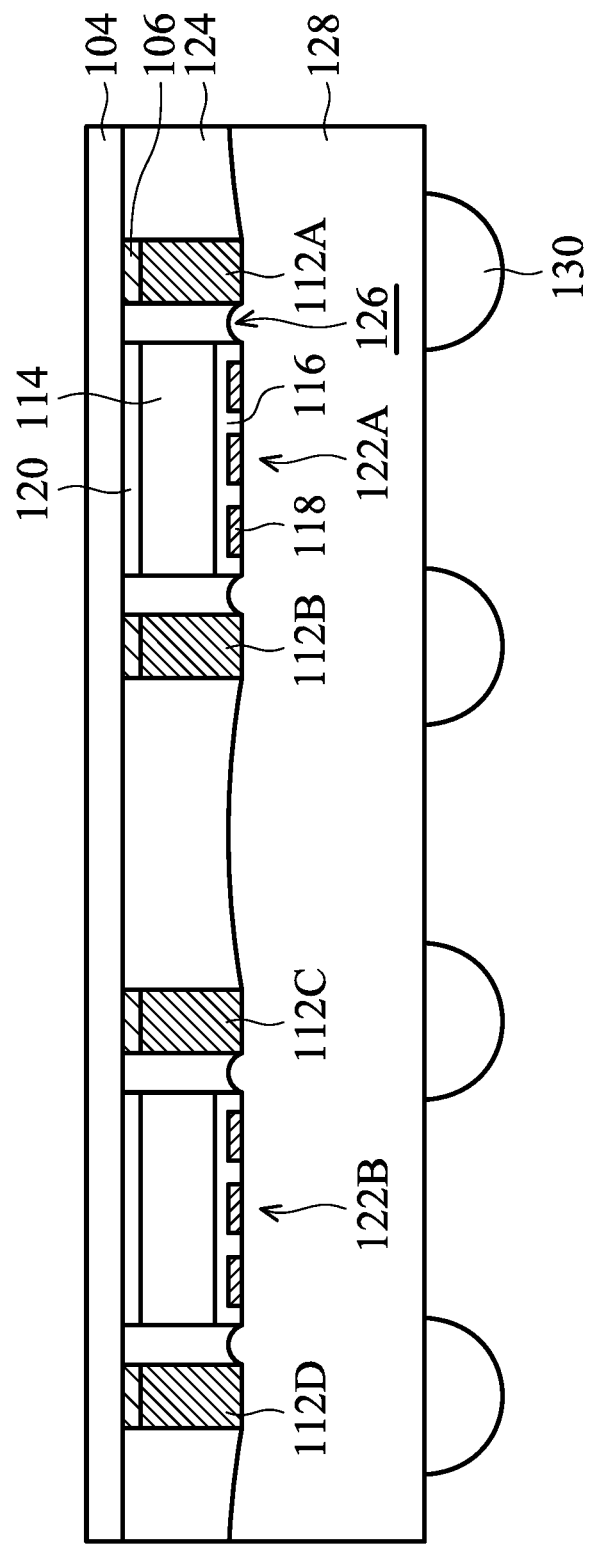

Afterwards, the carrier substrate 100 and adhesive layer 102 are removed, as shown in FIG. 1J in accordance with some embodiments. In some embodiments, a light irradiation operation is used to separate the carrier substrate 100 and adhesive layer 102 from the base layer 104.

Figure 1K:
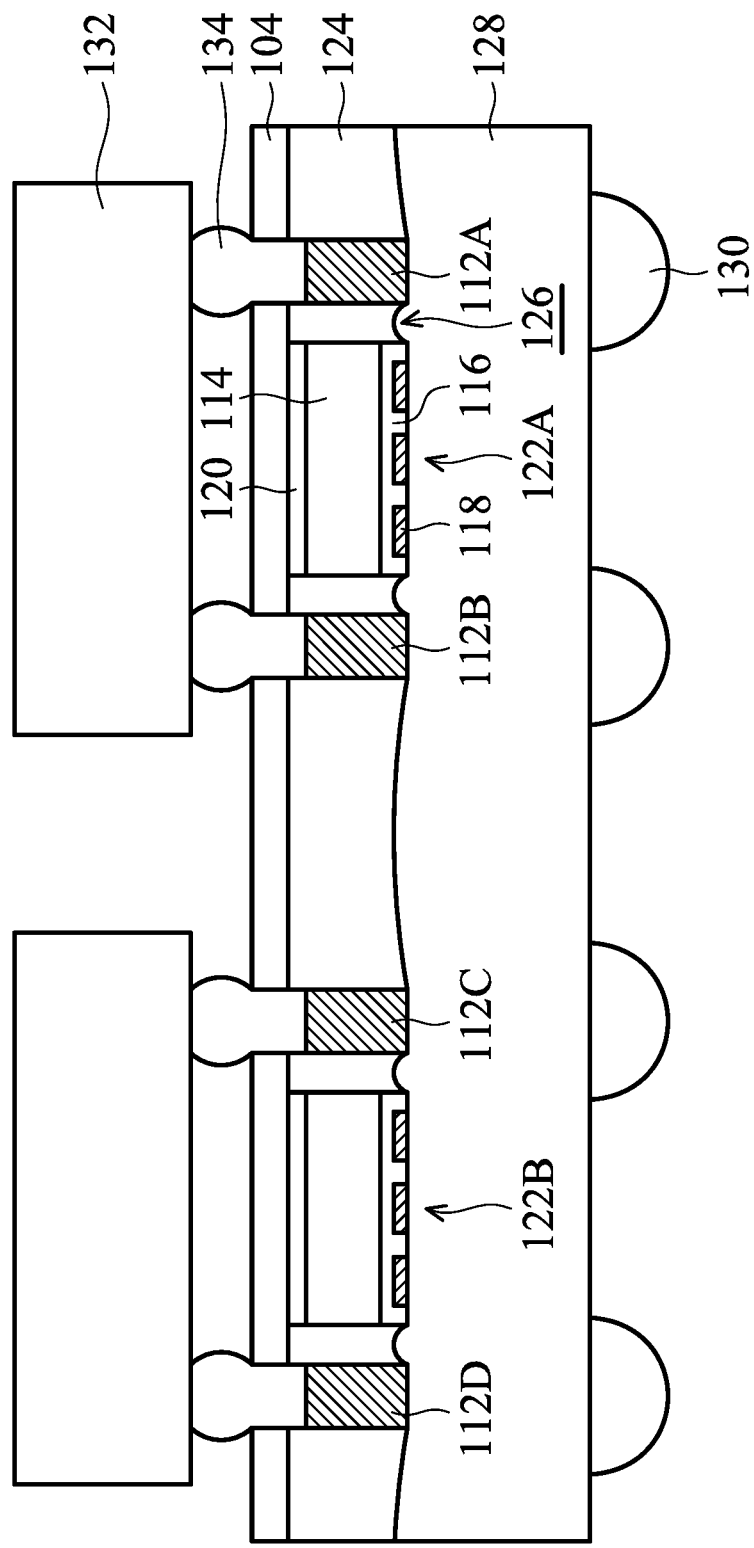

As shown in FIG. 1K, other elements 132 are stacked over the structure shown in FIG. 1J, in accordance with some embodiments. The elements 132 may include chip packages, semiconductor dies, passive devices, other suitable structures, or a combination thereof. In some embodiments, connectors 134 are formed between the elements 132 and the conductive structures such as the conductive structures 112A, 112B, 112C, and 112D. Electrical connections between the elements 132 and the semiconductor dies 122A and 122B may therefore be established.

Figure 1L:
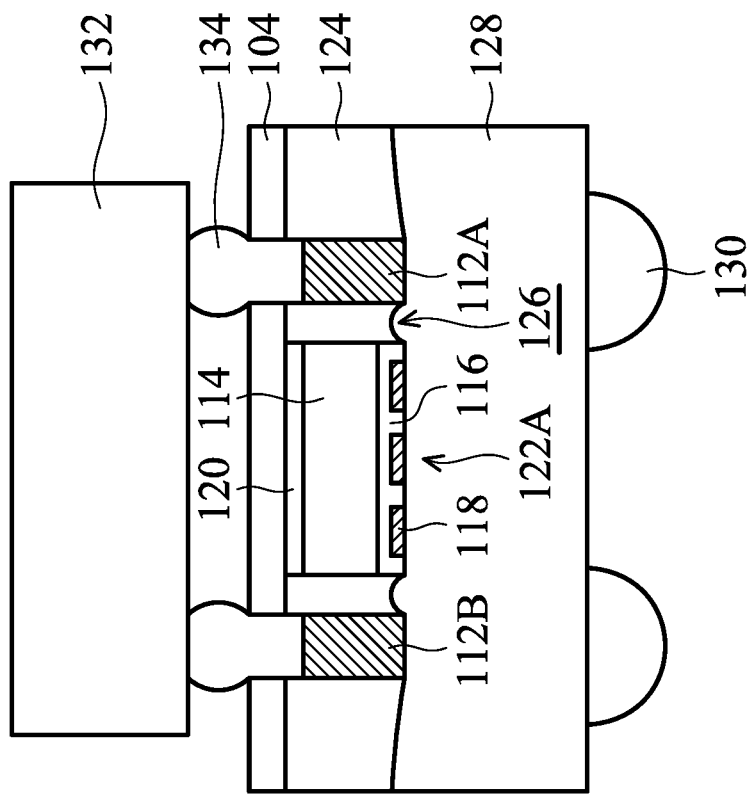

As shown in FIG. 1L, a dicing process is performed to separate the structure as shown in FIG. 1K into multiple chip packages, in accordance with some embodiments. As a result, a chip package with a fan-out structure is formed. In some other embodiments, more elements may be stacked on or bonded onto the structure as shown in FIG. 1K before the dicing process.

Figure 3A:
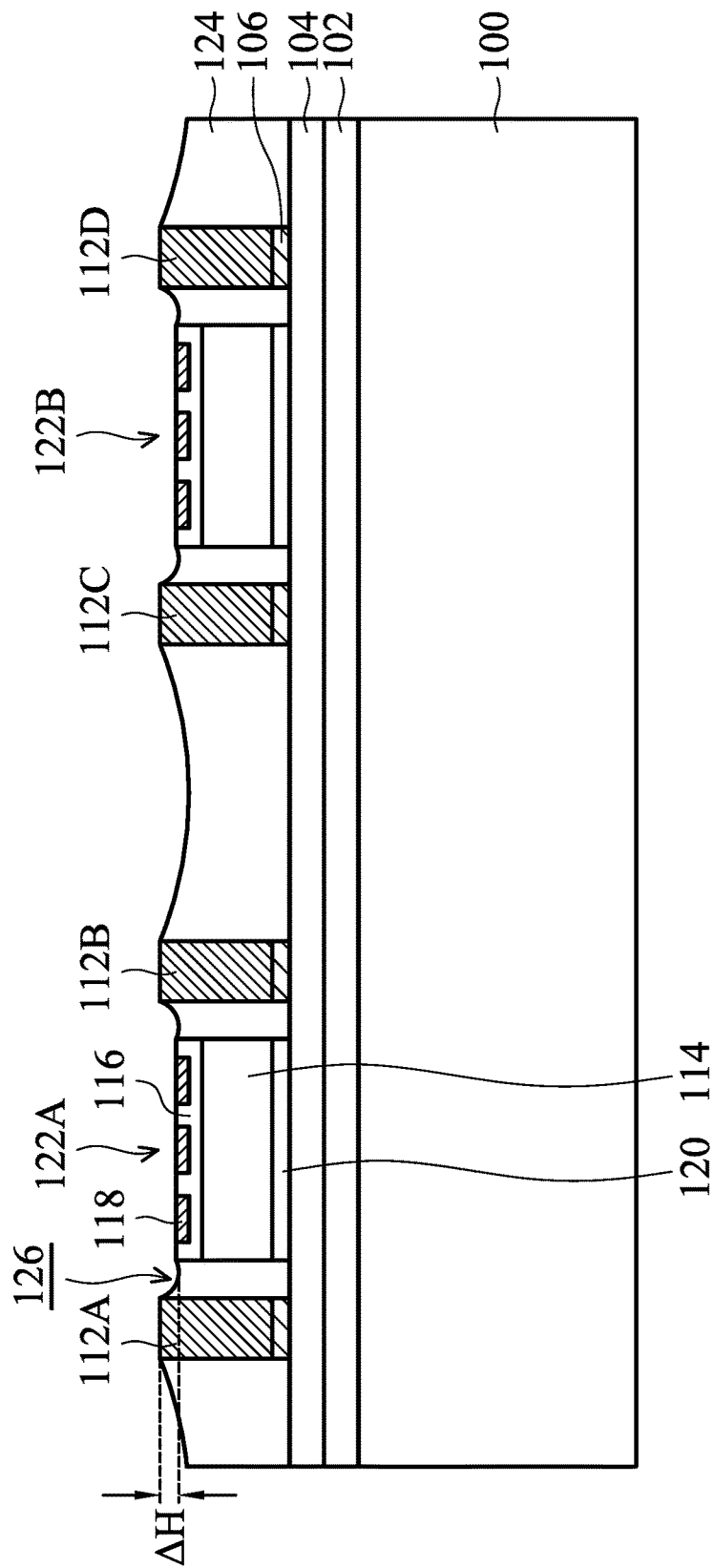
FIGS. 3A-3B are cross-sectional views of various stages of a process for forming a chip package, in accordance with some embodiments.
Figure 3B:
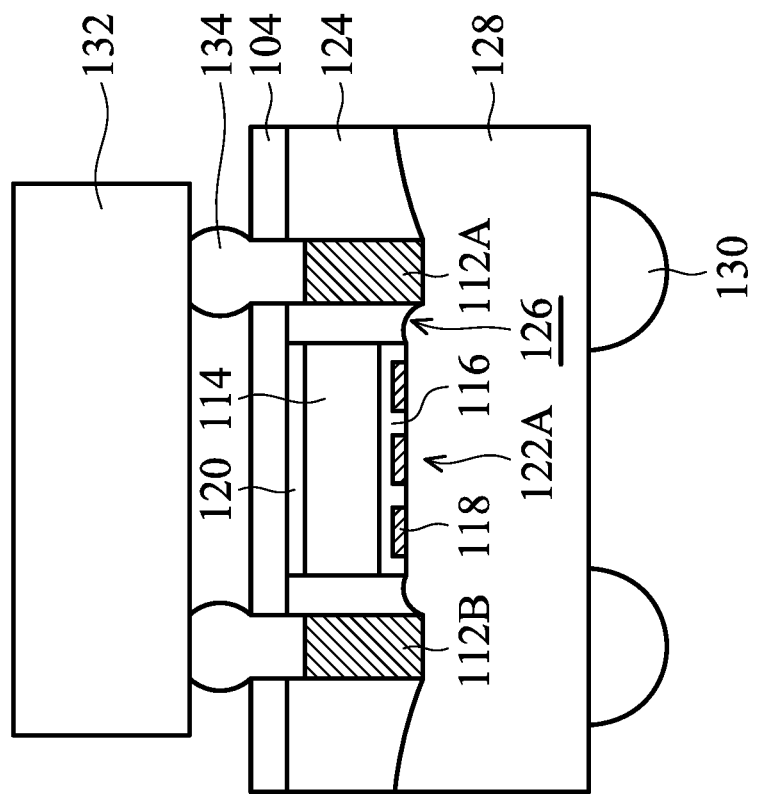

Many variations and/or modifications can be made to embodiments of the disclosure. FIGS. 3A-3B are cross-sectional views of various stages of a process for forming a chip package, in accordance with some embodiments.

As shown in FIG. 3A, a structure similar to the structure shown in FIG. 1H is formed, in accordance with some embodiments. As shown in FIG. 3A, the top surfaces of the conductive structures 112A, 112B, 112C, and 112D are higher than the top surfaces of the semiconductor dies 122A and 122B. In some embodiments, if the conductive structures 112A, 112B, 112C, and 112D are higher than the semiconductor dies 122A and 122B, the formation of the protection layer 124 is performed better. The risk that some molding compound is formed on the conductive structures 112A, 112B, 112C, and 112D or the semiconductor dies 122A and 122B is significantly reduced. In some embodiments, there is a height difference ΔH between the conductive structure 112A and the semiconductor die 122A in a range from about 2 μm to about 3 μm.

In some cases, if the height difference ΔH is less than about 2 μm (such as 1 μm or less), there might be some molding compound material formed on the top surfaces of the conductive structures 112A, 112B, 112C, and 112D after the removal of the mold 200. As a result, electrical connection to the conductive structures 112A, 112B, 112C, and 112D may be negatively affected. Alternatively, an additional cleaning operation may need to be performed to remove the portion of the molding compound material formed on the top surfaces of the conductive structures 112A, 112B, 112C, and 112D. Fabrication cost and process time may be increased.

In some other cases, if the height difference ΔH is greater than about 3 μm (such as 4 μm or more), there might be some molding compound material formed on the top surfaces of the conductive pads 118 of the semiconductor dies 122A and 122B after the removal of the mold 200. As a result, electrical connection to the semiconductor dies 122A and 122B may be negatively affected. Alternatively, an additional cleaning operation may need to be performed to remove the portion of the molding compound material formed on the top surfaces of the conductive pads 118. Fabrication cost and process time may be increased.

However, it should be appreciated that embodiments of the disclosure are not limited thereto. Many variations and/or modifications can be made to embodiments of the disclosure. In some other embodiments, the height difference ΔH is in a different range. In some embodiments, the height difference ΔH is in a range from about 1 μm to about 5 μm. In some other embodiments, the height difference ΔH is in a range from about 0.1 μm to about 10 μm.

Afterwards, processes similar to or the same as those shown in FIGS. 1I-1L, 2A-1 to 2C-1, and 2A-2 to 2C-2 are performed to form a chip package, as shown in FIG. 3B in accordance with some embodiments.

Embodiments of the disclosure form a chip package having a semiconductor die and multiple conductive structures. The conductive structures penetrate through a protection layer (or a molding compound layer) that surrounds the semiconductor die and the conductive structures. A mold is used to assist in the formation of the protection layer. The protection layer may not need to be thinned to expose the conductive structures and/or conductive pads of the semiconductor die. Fabrication cost and process time are significantly reduced. Damage due to the thinning process may also be prevented. A cutting process is used to assist in the formation of the conductive structures. Fabrication cost and process time are further reduced.

In accordance with some embodiments, a method for forming a chip package is provided. The method includes forming multiple conductive structures over a carrier substrate and disposing a semiconductor die over the carrier substrate. The method also includes disposing a mold over the carrier substrate. The method further includes forming a protection layer between the mold and the carrier substrate to surround the semiconductor die and the conductive structures. In addition, the method includes removing the mold.

In accordance with some embodiments, a method for forming a chip package is provided. The method includes forming a plurality of conductive structures over a carrier substrate. The method also includes cutting upper portions of the conductive structures so that top surfaces of the conductive structures are substantially coplanar with each other. The method further includes disposing a semiconductor die over the carrier substrate. In addition, the method includes forming a protection layer over the carrier substrate to surround the conductive structures and the semiconductor die.

In accordance with some embodiments, a chip package is provided. The chip package includes a semiconductor die and a protection layer encapsulating the semiconductor die. The chip package also includes a conductive structure in the protection layer and separated from the semiconductor die by the protection layer. The protection layer has a recess between the semiconductor die and the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package, comprising:
   forming conductive structures over a carrier substrate;
   disposing a semiconductor die over the carrier substrate;
   disposing a mold over the carrier substrate;
   injecting a molding compound material into the mold through an opening of the mold to form a protection layer between the mold and the carrier substrate to surround the semiconductor die and the conductive structures, wherein the mold comprises a release film, the release film is in direct contact with the conductive structures during the injecting of the molding compound material, and the release film is in direct contact with the semiconductor die during the injecting of the molding compound material;
   and removing the mold.

2. The method for forming a chip package as claimed in claim 1, further comprising:
   forming an interconnection structure over the protection layer, the conductive structures, and the semiconductor die; and
   removing the carrier substrate.

3. The method for forming a chip package as claimed in claim 2, wherein the protection layer and the conductive structures are not planarized after the removal of the mold and before the formation of the interconnection structure.

4. The method for forming a chip package as claimed in claim 1, further comprising cutting upper portions of the conductive structures so that top surfaces of the conductive structures are substantially coplanar with each other.

5. The method for forming a chip package as claimed in claim 1, further comprising:
   forming a mask layer over the carrier substrate, wherein the mask layer has a plurality of openings exposing a seed layer over the carrier substrate;
   forming the conductive structures in the openings by plating;
   cutting upper portions of the mask layer and upper portions of the conductive structures so that top surfaces of the conductive structures are substantially coplanar with each other; and
   removing the mask layer.

6. The method for forming a chip package as claimed in claim 1, wherein height difference between the semiconductor die and one of the conductive structures is in a range from about 2 μm to about 3 μm.

7. A method for forming a chip package, comprising:
forming conductive structures over a carrier substrate;
cutting upper portions of the conductive structures so that top surfaces of the conductive structures are substantially coplanar with each other;
disposing a semiconductor die over the carrier substrate after cutting the upper portions of the conductive structures;
disposing a mold over the carrier substrate;
injecting a molding compound material into the mold through an opening of the mold to form a protection layer over the carrier substrate to surround the conductive structures and the semiconductor die, wherein the mold comprises a release film, the release film is in direct contact with the conductive structures during the injecting of the molding compound material, and the release film is in direct contact with the semiconductor die during the injecting of the molding compound material; and
removing the mold.

8. The method for forming a chip package as claimed in claim 7, further comprising:
forming an interconnection structure over the protection layer, the conductive structures, and the semiconductor die;
forming a plurality of conductive bumps over the interconnection structure; and
removing the carrier substrate.

9. The method for forming a chip package as claimed in claim 8, wherein the protection layer is not thinned before the formation of the interconnection structure.

10. The method for forming a chip package as claimed in claim 7, wherein the conductive structures are formed using a plating process.

11. The method for forming a chip package as claimed in claim 7, wherein the molding compound material does not cover the top surfaces of the conductive structures during the injecting of the molding compound material.

12. The method for forming a chip package as claimed in claim 8, wherein the top surfaces of the conductive structures are higher than a top surface of the semiconductor die.

13. A method for forming a chip package, comprising:
forming a conductive structure over a carrier substrate;
disposing a semiconductor die over the carrier substrate;
disposing a mold over the carrier substrate;
injecting a material between the mold and the carrier substrate to form a protection layer surrounding the semiconductor die, wherein the mold comprises a release film, the release film is in direct contact with the conductive structure during the injecting of the material, and the release film is in direct contact with the semiconductor die during the injecting of the material; and removing the mold.

14. The method for forming a chip package as claimed in claim 13, further comprising cutting an upper portion of the conductive structure before the protection layer is formed.

15. The method for forming a chip package as claimed in claim 13, wherein the material does not cover a conductive pad of the semiconductor die during the material is injected.

16. The method for forming a chip package as claimed in claim 13, further comprising removing an upper portion of the conductive structure by cutting before the protection layer is formed.

17. The method for forming a chip package as claimed in claim 13, further comprising performing a thermal process to harden the material such that the protection layer is formed.

18. The method for forming a chip package as claimed in claim 13, further comprising:
forming a mask layer over the carrier substrate, wherein the mask layer has an opening exposing a seed layer over the carrier substrate;
forming the conductive structure in the opening by plating;
cutting an upper portion of the mask layer and an upper portion of the conductive structure; and removing the mask layer.

19. The method for forming a chip package as claimed in claim 1, wherein the semiconductor die is disposed between two of the conductive structures.

* * * * *